United States Patent
Chen et al.

(10) Patent No.: US 10,197,621 B2
(45) Date of Patent: Feb. 5, 2019

(54) TESTING DEVICE

(71) Applicant: KINGSTON DIGITAL, INC., Fountain Valley, CA (US)

(72) Inventors: David Chen, Fountain Valley, CA (US); Chengvee Ong, Fountain Valley, CA (US); Chichih Yu, Hsinchu (TW)

(73) Assignee: Kingston Digital, Inc., Fountain Valley, CA (US)

( * ) Notice: Subject to any disclaimer, the term of this patent is extended or adjusted under 35 U.S.C. 154(b) by 359 days.

(21) Appl. No.: 14/297,897

(22) Filed: Jun. 6, 2014

(65) Prior Publication Data

US 2014/0361802 A1 Dec. 11, 2014

(30) Foreign Application Priority Data

Jun. 7, 2013 (TW) .............................. 102120287 A (51) Int. Cl.
 *G01R 31/28* (2006.01)
 *G11C 29/56* (2006.01)

(52) U.S. Cl.
 CPC .... *G01R 31/2863* (2013.01); *G11C 29/56016* (2013.01); *G11C 2029/5602* (2013.01)

(58) Field of Classification Search
 CPC ............ G01R 1/07342; G01R 1/07314; G01R 1/06794

(Continued)

(56) References Cited

U.S. PATENT DOCUMENTS 5,559,443 A 9/1996 Yokoya et al.
6,157,080 A 12/2000 Tamaki et al.
(Continued)

FOREIGN PATENT DOCUMENTS

TW 406382 B 9/2000
TW 200402854 A 2/2004
(Continued)

OTHER PUBLICATIONS

Search Report to the corresponding United Kingdom Patent Application No. GB1410076.2, dated Dec. 11, 2014, 3 pages.
(Continued)

*Primary Examiner* — Melissa Koval
*Assistant Examiner* — Trung Nguyen
(74) *Attorney, Agent, or Firm* — Skaar Ulbrich Macari, P.A.

(57) ABSTRACT

A testing device includes a system circuit board, a first chip component, a supporting structure, a circuit board and an interposer. The system circuit board has a surface where the first chip component is disposed. The first chip component is connected to the system circuit board. The supporting structure is disposed on the surface and surrounds the first chip component; the circuit board is fixed on the supporting structure and keeps distance from the first chip component. The circuit board has a connector for connecting to a chip component that is to be tested. The interposer is located between the circuit board and the first chip component. The circuit board is connected to the first chip component via the interposer. The first chip component need not connect to the chip component to be tested, so is less liable to be damaged by the frequent testing.

14 Claims, 10 Drawing Sheets

(58) Field of Classification Search
USPC ...... 324/756.01–758.01, 750.01–750.3, 500, 324/600, 754.07–754.08, 762.01
See application file for complete search history.

(56) References Cited

U.S. PATENT DOCUMENTS

| | | |
|---|---|---|
| 2003/0080762 A1 | 5/2003 | Kim et al. |
| 2005/0275418 A1* | 12/2005 | Chong .............. G01R 31/2889 324/750.25 |
| 2007/0024314 A1 | 2/2007 | Teng et al. |
| 2008/0126863 A1 | 5/2008 | Co et al. |
| 2009/0121736 A1* | 5/2009 | Jenkins .............. G01R 31/2884 324/754.23 |

FOREIGN PATENT DOCUMENTS

| | | |
|---|---|---|
| TW | M282317 U | 12/2005 |
| TW | 200945468 A | 11/2009 |

OTHER PUBLICATIONS

Office Action to the corresponding Taiwan Patent Application No. 102120287 rendered by the Taiwan Intellectual Property Office (TIPO) dated Dec. 13, 2016, 6 pages (including English translation).

\* cited by examiner

TESTING DEVICE

PRIORITY

This application claims priority to Taiwan Patent Application No. 102120287, filed on Jun. 7, 2013, which is herein incorporated by reference in its entirety.

FIELD

The present invention provides a testing device, and more particularly, provides a testing device for testing a chip component.

BACKGROUND

In general, after the general design of a circuit module of a portable electronic product has been made, the circuit module of an engineering version with a relatively large size will be made according to the design. Then, a series of tests will be made on the circuit module of the engineering version to determine whether the design of the circuit module meets the requirements. If the design meets the requirements, the circuit module of the engineering version will be used by the manufacturer to manufacture a circuit module with a relatively small size so that the relatively small circuit module can be disposed into a portable electronic product with a limited accommodating space.

When the circuit module of the engineering version is tested, one of the tests is to know the electrical characteristics between the particular processor of the circuit module and a plurality of different memories. The conventional testing method is detailed. First, with reference to FIG. 1, a plurality of different memories 92 are connected to the processor 91 of a circuit module 90 of an engineering version sequentially, and then the electrical characteristics of the memories 92 or the processor 91 are measured.

Figure 1:
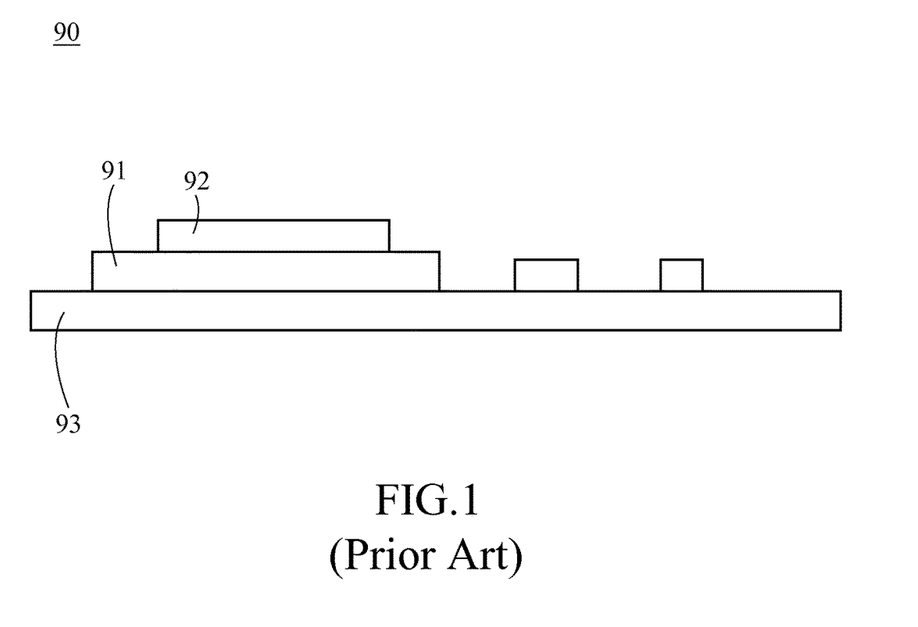
FIG. 1 is a schematic view of a conventional testing device.

The aforesaid conventional testing method tends to cause damage to the processor 92 because of the following reasons: (1) after the memories 92 are repeatedly plugged in and removed from the processor 91, the contacts of the processor 91 tend to wear out, which will result in poor contact; or (2) every time the memories 92 are plugged into the processor 91, the processor 91 will be subjected to pressure from the memories 92, and the processor 91 or the circuit board 93 disposed below the processor 91 will be damaged by the repeated pressure.

If the processor is damaged, the testing time will be prolonged because the damaged processor must be replaced by a new processor. The testing cost will also be increased substantially because the cost of the processor is relatively high.

Accordingly, a need still exists in the art to provide a device capable of improving at least one of the aforesaid drawbacks.

SUMMARY

An objective of certain embodiments of the present invention includes providing a testing device for testing a chip component to be tested. Important components of the testing device are less liable to be damaged, so the usage cost for the user can be reduced.

To achieve the aforesaid objective, a testing device for a chip component is disclosed. The testing device includes: a system circuit board with a surface; a first chip component disposed on the surface of the system circuit board and electrically connected to the system circuit board; a supporting structure, disposed on the surface of the system circuit board that at least surrounds the first chip component; a circuit board that is fixed on the supporting structure and is separated from the first chip component, wherein the circuit board has a connector for connecting to the chip component to be tested; and an interposer, located between the circuit board and the first chip component, wherein the circuit board is electrically connected to the first chip component via the interposer.

The detailed technology and preferred embodiments implemented for the subject invention are described in the following paragraphs accompanying the appended drawings for people skilled in this field to well appreciate the features of the claimed invention.

DETAILED DESCRIPTION

In the following descriptions, the present invention will be explained with reference to various example embodiments; nevertheless, these embodiments are not intended to limit the present invention to any specific example, environment, application, or particular implementation described herein. Therefore, descriptions of these example embodiments are only provided for purpose of illustration rather than to limit the present invention. The various features or aspects discussed herein can also be combined in additional combinations and embodiments, whether or not explicitly discussed herein, without departing from the scope of the invention.

Figure 2:
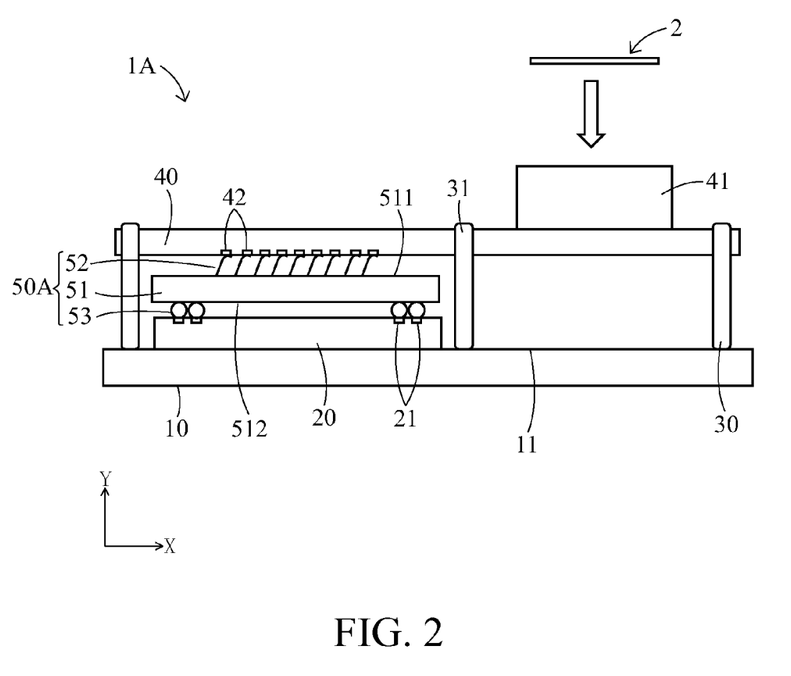
FIG. 2 is a schematic plan view of a testing device according to the first embodiment of the present invention.

FIG. 2 illustrates a schematic plan view of a testing device according to the first embodiment of the present invention. A testing device 1A is proposed in the first embodiment of the present invention. The testing device 1A can be used for testing the electrical characteristics of a chip component 2 to be tested which may be a memory chip or the like. The testing device 1A comprises the following: a system circuit board 10, a first chip component 20, a supporting structure 30, a circuit board 40 and an interposer 50A. The technical contents of each of the aforesaid components will be sequentially described hereinafter.

The system circuit board 10 is a structure on which various electronic components (not shown) can be disposed. The system circuit board 10 has a circuitry of a specific pattern that allows for transmission of electric energy or signals between the electronic components. The system circuit board 10 may also function as a substrate of a circuit module of an engineering version of a portable electronic device. The system circuit board 10 has a surface (i.e., top surface) 11 on which the electronic components are disposed.

The first chip component 20 (or termed as the primary chip component) is used for executing a particular program so that a particular function of the electronic device can be achieved. The first chip component 20 may be any kind of processor or controller, and is not limited in this embodiment. The first chip component 20 may be disposed on the surface 11 of the system circuit board 10 and electrically connected to the system circuit board 10. In this way, electronic signals can be transmitted between the first chip component 20 and the electronic components (not shown) disposed on the system circuit board 10. Furthermore, the first chip component 20 also has a plurality of contacts 21 which may be disposed on the top surface of the first chip component 20 to be electrically connected to the interposer 50A.

The supporting structure 30 is used for supporting other components (e.g., the circuit board 40) so that the components that are supported are separated from the first chip component 20. The supporting structure 30 may be comprised of a plurality of pillars 31 or a plurality of walls (not shown). The supporting structure 30 may be disposed on the surface 11 of the system circuit board 10 and at least surrounds the first chip component 20. That is, the supporting structure 30 is at least located at the two sides of the first chip component 20 and may be optionally located at other positions on the surface 11.

In this embodiment, the supporting structure 30 may be fixed on the surface 11 of the system circuit board 10 so that the supporting structure 30 and the system circuit board 10 can be formed integrally. In other embodiments, the supporting structure 30 may only be placed on the surface 11 of the system circuit board 10 without being fixed to the system circuit board 10. In other words, after the supporting structure 30 has been used, it can be removed from the system circuit board 10 and then used on another system circuit board (not shown).

The circuit board 40 is also a structure on which electronic components can be disposed, but the size (the length or the width) thereof may be smaller than that of the system circuit board 10. The circuit board 40 may be fixed on the supporting structure 30 and separated from the first chip component 20. In other words, the circuit board 40 may be located above the first chip component 20. The circuit board 40 may comprise a connector 41 and a plurality of contacts 42, and the connector 41 and the contacts 42 may be electrically connected to each other. The connector 41 may be disposed on the top surface of the circuit board 40, while the contacts 42 may be disposed on the bottom surface of the circuit board 40.

The connector 41 is used for connecting the chip component 2 to be tested so the type of contacts of the connector 41 matches with the type of contacts of the tested chip component 2. Additionally, the connector 41 is preferably a socket connector, for example, a package-on-package (PoP) socket connector.

In this embodiment, the connector 41 of the circuit board 40 is separate from the first chip component 20 in the X direction which is perpendicular to the normal Y of the surface 11 of the system circuit board 10. In other words, the connector 41 is not located right above the first chip component 20; and instead, it is located at the front, the back, the left or the right sides of the first chip component 20. In this way, the force generated during the process of connecting the tested chip component 2 to the connector 41 will not be easily imposed on the first chip component 20.

The interposer 50A is used to achieve electrical connection between the circuit board 40 and the first chip component 20 so that the tested component 2 can be electrically connected to the first chip component 20. The interposer 50A may be located between the circuit board 40 and the first chip component 20, and it may be fixed to the circuit board 40 or the supporting structure 30.

Accordingly, the tested chip component 2 will not make contact with the first chip component 20 directly when the testing device 1A is testing the electrical characteristics between the tested chip component 2 and the first chip component 20. Therefore, the contacts 21 of the first chip component 20 will not wear out easily and the first chip component 20 will not be damaged easily due to the pressure. Accordingly, the life span of the first chip component 20 can be prolonged remarkably.

The interposer 50A can be implemented in various ways, and in the first embodiment, is implemented in the following way.

Figure 3A:
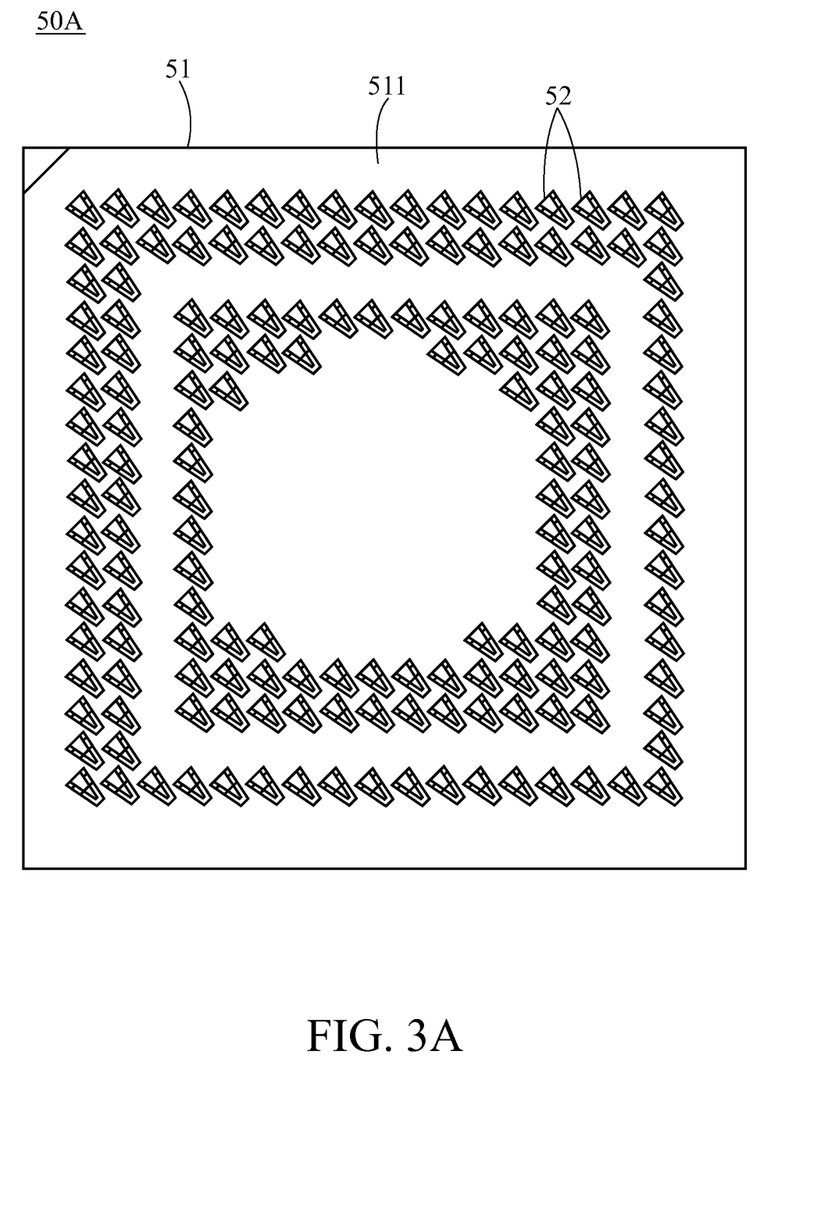
FIG. 3A is a top view of an interposer of the testing device shown in FIG. 2.
Figure 3B:
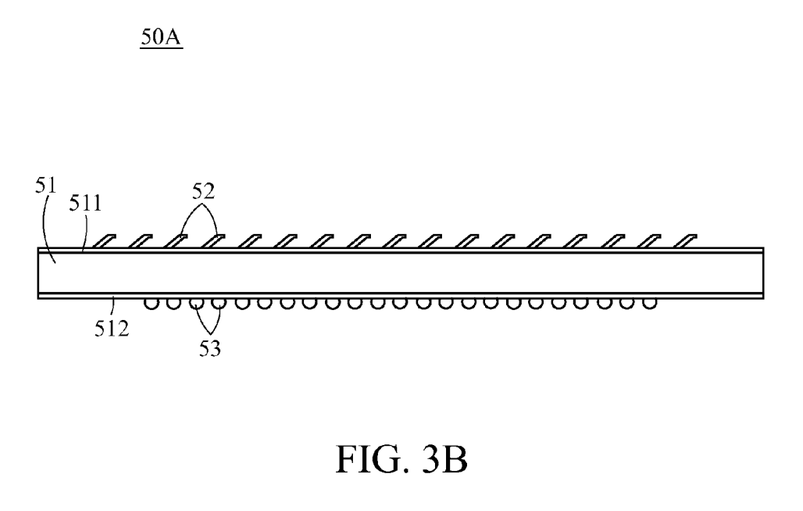
FIG. 3B is a side view of the interposer of the testing device shown in FIG. 2.
Figure 3C:
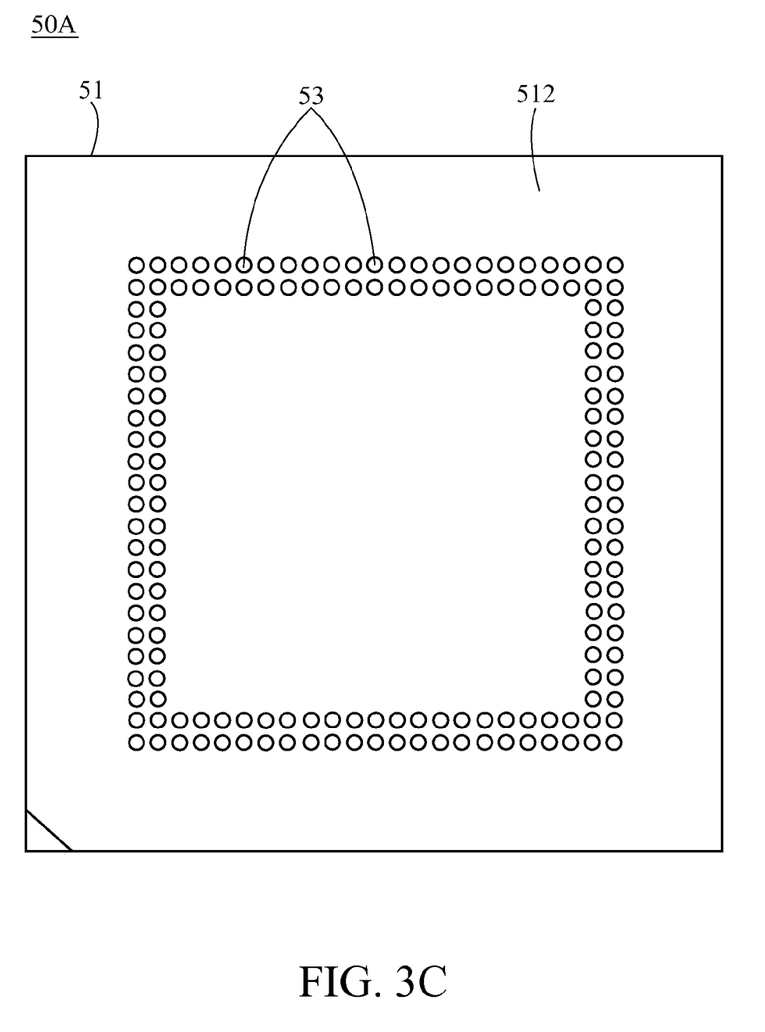
FIG. 3C is a bottom view of the interposer of the testing device shown in FIG. 2.

FIGS. 3A to 3C illustrate a top view, side view, and bottom view of the interposer of the testing device of FIG. 2. The interposer 50A comprises a substrate 51, a plurality of first conductive resilient sheets 52 and a plurality of bumps 53. The substrate 51 has a first surface 511 and a second surface 512 (i.e., a top surface and a bottom surface) opposite to each other. The first conductive resilient sheets 52 are disposed on the first surface 511, while the bumps 53 are disposed on the second surface 512. The first conductive resilient sheets 52 are electrically connected to the bumps 53 respectively. The electrical connection between the bumps 53 and the first conductive resilient sheets 52 may be achieved by conductive vias or interconnectors (not shown) within the substrate 51.

Each of the first conductive resilient sheets 52 is a mental resilient sheet. An end portion thereof is suspended without making contact with the first surface 511 of the substrate 51. The end portions of the first conductive resilient sheets 52 also protrude towards the circuit board 40 (i.e., protrude upwardly) to make contact with the contacts 42 of the circuit board 40 respectively. The bumps 53 on the second surface 512 make contact with the contacts 21 of the first chip component 20 respectively.

Thus, the function of the interposer 50A can be achieved. When the contacts 42 of the circuit board 40 make contact with the first conductive resilient sheets 52, the contacts 42 will exert a pushing force on the end portions of the first conductive resilient sheets 52 so that the contacts 42 can make close contact with the end portions of the first conductive resilient sheets 52. In this way, the contact resistance between the contacts 42 and the first conductive resilient sheets 52 can be reduced to increase the signal integrity.

Figure 4:
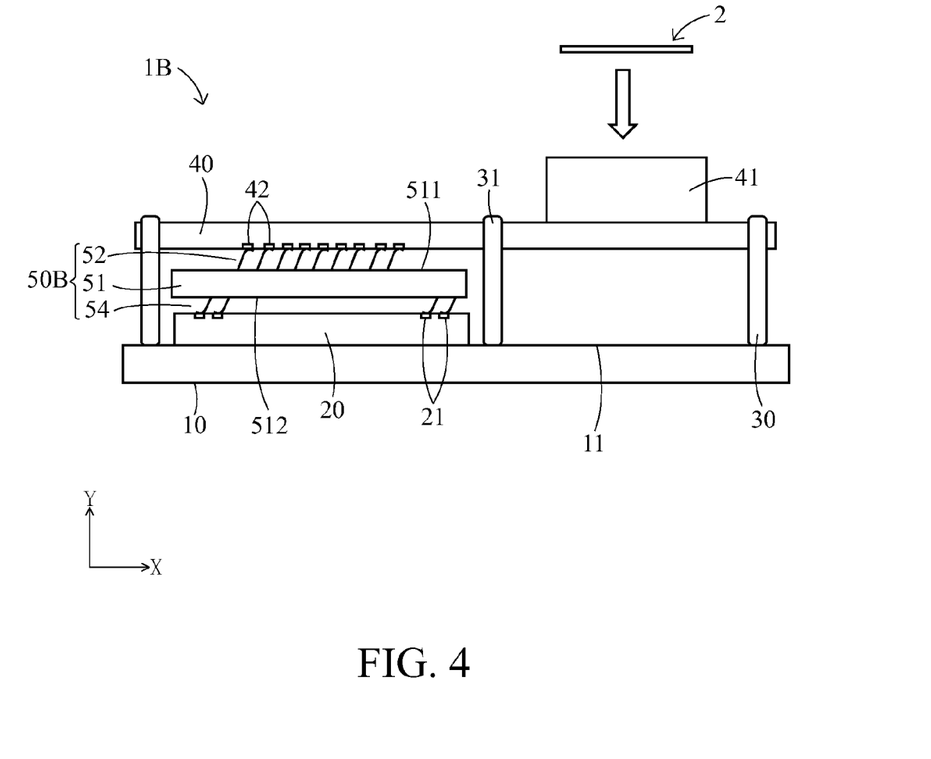
FIG. 4 is a schematic plan view of a testing device according to the second embodiment of the present invention.

FIG. 4 illustrates a schematic plan view of a testing device according to the second embodiment of the present invention. Another testing device 1B is proposed in the second embodiment of the present invention. The testing device 1B differs from the aforesaid testing device 1A at least in that the testing device 1B comprises an interposer 50B which is implemented in another way.

In detail, the interposer 50B comprises a substrate 51, a plurality of first conductive resilient sheets 52 and a plurality of second conductive resilient sheets 54. The second conductive resilient sheets 54 are disposed on the second surface 512. The first conductive resilient sheets 52 are electrically connected to the second conductive resilient sheets 54 respectively. The first conductive resilient sheets 52 make contact with the contacts 42 of the circuit board 40 respectively. The end portions of the second conductive resilient sheets 54 protrude towards the first chip component 20 (i.e., protrude downwardly) to make contact with the contacts 21 of the first chip component 20 respectively.

The interposer 50B can also function to connect the circuit board 40 and the first chip component 20. Furthermore, when the contacts 21 of the first chip component 20 make contact with the second conductive resilient sheets 54, the contacts 21 will exert a pushing force on the end portions of the second conductive resilient sheets 54 so that the contacts 21 can make close contact with the end portions of the second conductive resilient sheets 54. In this way, the contact resistance between the contacts 21 and the second conductive resilient sheets 54 can be reduced to increase the signal integrity.

Figure 5:
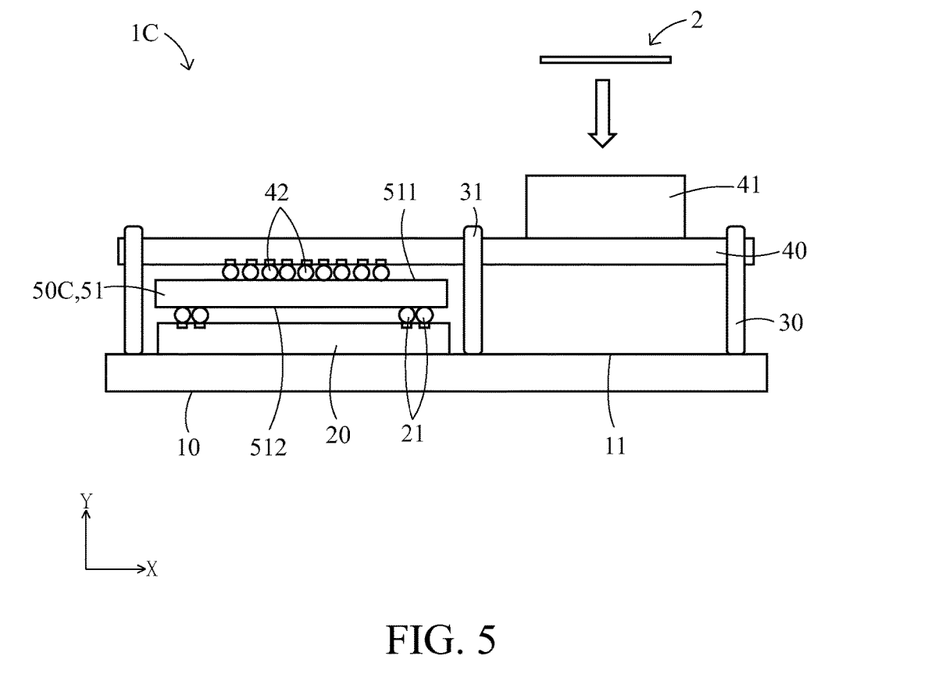
FIG. 5 is a schematic plan view of a testing device according to the third embodiment of the present invention.
Figure 6:
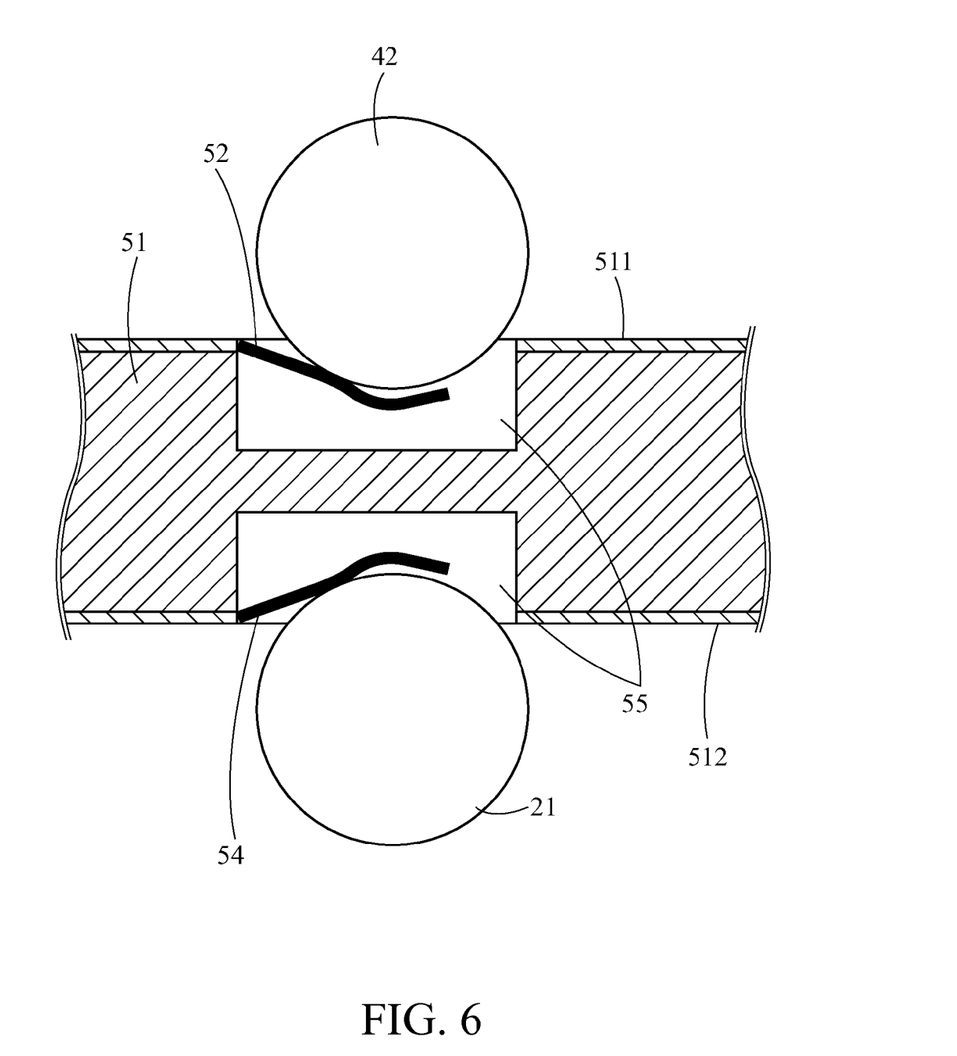
FIG. 6 is a partially enlarged detailed view of an interposer of the testing device shown in FIG. 5.

FIG. 5 is a schematic plan view of a testing device according to the third embodiment of the present invention, while FIG. 6 is a partially enlarged schematic view of an interposer of the testing device according to the third embodiment of the present invention. Another testing device 1C is proposed in the third embodiment of the present invention. The testing device 1C differs from the aforesaid testing device 1A or 1B at least in that the testing device 1C comprises an interposer 50C which is implemented in another way.

In detail, like the interposer 50B (as shown in FIG. 4), the interposer 50C also comprises a substrate 51, a plurality of first conductive resilient sheets 52 and a plurality of second conductive resilient sheets 54. However, the interposer 50C further comprises a plurality of recesses 55 which may be disposed on the first surface 511 and/or the second surface 512 of the substrate 51. The end portions of the first conductive resilient sheets 52 may sink into the recesses 55 respectively, and the end portions of the second conductive resilient sheets 54 may also sink into the recesses 55 respectively. Thus, the end portions of the first conductive resilient sheets 52 will not protrude from the first surface 511 and the end portions of the second conductive resilient sheets 52 will not protrude from the second surface 512.

Thus, when the end portions of the first conductive resilient sheets 52 make contact with the contacts 42, which are in the form of bumps, of the circuit board 40, the first conductive resilient sheets 52 can make contact with the contacts 42 more stably because the end portions of the first conductive resilient sheets 52 are sunk into the recesses 55. This is also the same case for the end portions of the second conductive resilient sheets 54 and the contacts 21 of the first chip component 20.

Figure 7:
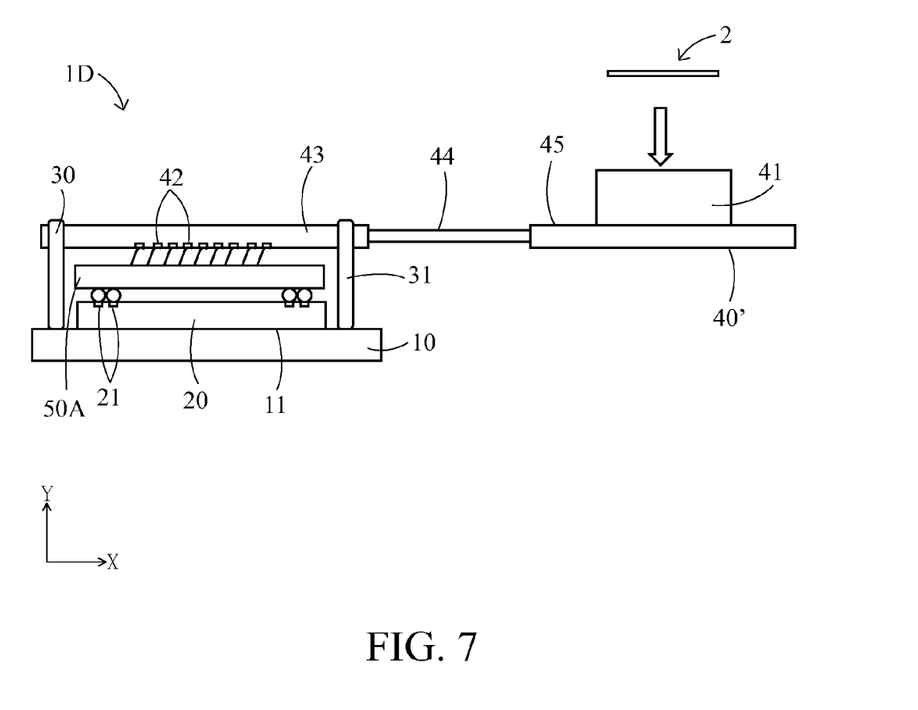
FIG. 7 is a schematic plan view of a testing device according to the fourth embodiment of the present invention.
Figure 8:
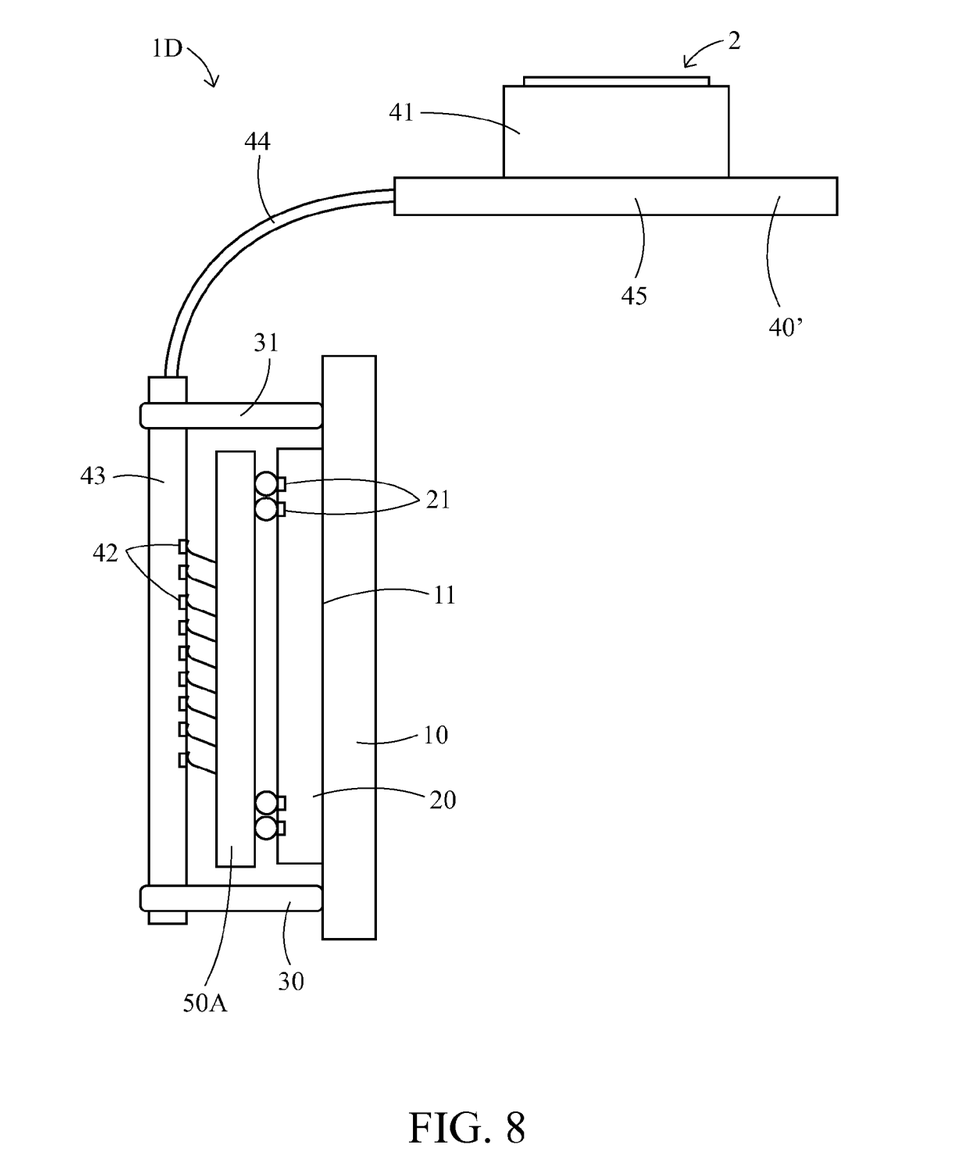
FIG. 8 is another schematic plan view of the testing device according to the fourth embodiment of the present invention.

FIGS. 7 and 8 show two schematic plan views of a testing device according to the fourth embodiment of the present invention. Another testing device 1D is proposed in the fourth embodiment of the present invention. The testing device 1D differs from the aforesaid testing device 1A, 1B or 1C at least in that: the testing device 1D comprises a circuit board 40' which is implemented in another way.

In detail, in addition to the connector 41 and the contacts 42, the circuit board 40' further comprises a first rigid portion 43, a flexible portion 44 and a second rigid portion 45. The first rigid portion 43 and the second rigid portion 45 are portions with relatively good structural rigidity; in other words, it is relatively hard to bend the first rigid portion 43 and the second rigid portion 45 significantly. On the contrary, the flexible portion 44 is a portion which can be bent significantly. The two sides of the flexible portion 44 are connected to the first rigid portion 43 and the second rigid portion 45 respectively. Therefore, when the flexible portion 44 is bent, the relative positions of the first rigid portion 43 and the second rigid portion 45 can be easily changed.

On the other hand, the first rigid portion 43 may be fixed on the supporting structure 30, while the connector 41 may be disposed on the second rigid portion 45. Thus, when the flexible portion 44 is bent, the position of the connector 41 can be easily changed.

Accordingly, as shown in FIG. 8, when the system circuit board 10, the first chip component 20, the supporting structure 30 of the testing device 1D as well as the first rigid portion 43 of the circuit board 40' are disposed vertically to save space, the second rigid portion 45 and the connector 41 may still be disposed horizontally. In this way, the tested chip component 2 can be easily connected to the connector 41.

According to the above descriptions, the first chip component is less liable to be damaged when the tested chip component is tested by each of the testing devices proposed in the embodiments of the present invention. Thereby, the service life of the first chip component can be prolonged to achieve one of the objectives of the present invention.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A testing device for testing a chip component to be tested, the testing device comprising:
   a system circuit board having a surface;
   a first chip component, disposed on the surface of the system circuit board and electrically connected to the system circuit board;
   a supporting structure, disposed on the surface and at least surrounding the first chip component;
   a circuit board, fixed on the supporting structure and being separated from the first chip component, wherein the circuit board has a connector for electrically connecting to the chip component to be tested; and
   an interposer, located between the circuit board and the first chip component, wherein the circuit board is electrically connected to the first chip component via the interposer.

2. The testing device of claim 1, wherein the interposer has a substrate, a plurality of first conductive resilient sheets and a plurality of second conductive resilient sheets; the substrate has a first surface and a second surface opposite to each other; the first conductive resilient sheets are disposed on the first surface, the second conductive resilient sheets are disposed on the second surface, and the first conductive resilient sheets are electrically connected to the second conductive resilient sheets respectively; each of the circuit board and the first chip component has a plurality of contacts, and the first conductive resilient sheets make contact with the contacts of the circuit board respectively, and the second conductive resilient sheets make contact with the contacts of the first chip component respectively.

3. The testing device of claim 1, wherein the interposer has a substrate, a plurality of first conductive resilient sheets and a plurality of bumps; the substrate has a first surface and a second surface opposite to each other; the first conductive resilient sheets are disposed on the first surface, the bumps are disposed on the second surface, and the first conductive resilient sheets are electrically connected to the bumps respectively; each of the circuit board and the first chip component has a plurality of contacts, the first conductive resilient sheets make contact with the contacts of the circuit board respectively, and the bumps make contact with the contacts of the first chip component respectively.

4. The testing device of claim 3, wherein the substrate has a plurality of recesses which are disposed on the first surface, and end portions of the first conductive resilient sheets are sunk into the recesses respectively.

5. The testing device of claim 2, wherein the substrate has a plurality of recesses which are disposed on the first surface, and end portions of the first conductive resilient sheets are sunk into the recesses respectively.

6. The testing device of claim 2, wherein the substrate has a plurality of recesses which are disposed on the second surface, and end portions of the second conductive resilient sheets are sunk into the recesses respectively.

7. The testing device of claim 1, wherein the circuit board further has a first rigid portion, a flexible portion and a second rigid portion; the flexible portion has two sides which are connected to the first rigid portion and the second rigid portion respectively; the first rigid portion is fixed on the supporting structure, and the connector is disposed on the second rigid portion.

8. The testing device of claim 7, wherein the connector is a socket connector.

9. The testing device of claim 8, wherein the connector is a package-on-package socket connector.

10. The testing device of claim 1, wherein the connector is a socket connector.

11. The testing device of claim 10, wherein the connector is a package-on-package socket connector.

12. The testing device of claim 1, wherein the chip component to be tested is a memory chip.

13. The testing device of claim 1, wherein the connector of the circuit board is separated from the first chip component in a direction which is perpendicular to a normal of the surface of the system circuit board.

14. A device for testing a target chip component, the device comprising:
a system circuit board having a surface;
a first chip component that is disposed on the surface of the system circuit board and electrically connected to the system circuit board;
a support that is disposed on the surface of and surrounds the first chip component;
a circuit board fixed on the support and separated from the first chip component; and
an interposer disposed between the circuit board and the first chip component,
wherein the circuit board is electrically connected to the first chip component via the interposer, and
wherein the circuit board includes a connector configured to electrically connect to the target chip component that is to be tested.

* * * * *